United States Patent
Liu et al.

(10) Patent No.: US 6,897,284 B2
(45) Date of Patent: May 24, 2005

(54) POLYTHIOPHENES AND DEVICES THEREOF

(75) Inventors: Ping Liu, Mississauga (CA); Yiliang Wu, Mississauga (CA); Lu Jiang, Oakville (CA); Beng S. Ong, Mississauga (CA)

(73) Assignee: Xerox Corporation, Stamford, CT (US)

( * ) Notice: Subject to any disclaimer, the term of this patent is extended or adjusted under 35 U.S.C. 154(b) by 63 days.

(21) Appl. No.: 10/392,592

(22) Filed: Mar. 19, 2003

(65) Prior Publication Data

US 2004/0186265 A1 Sep. 23, 2004

(51) Int. Cl.$^7$ .............................................. C08G 75/00
(52) U.S. Cl. ..................... 528/373; 528/377; 528/485; 528/491; 528/498
(58) Field of Search .............................. 528/373, 377, 528/485, 491, 498

(56) References Cited

U.S. PATENT DOCUMENTS

| | | | |
|---|---|---|---|
| 5,069,823 A | * 12/1991 | Sato et al. | ................... 252/500 |
| 5,347,144 A | * 9/1994 | Garnier et al. | ................ 257/40 |
| 5,619,357 A | 4/1997 | Angelopoulos et al. | ..... 349/110 |
| 5,777,070 A | 7/1998 | Inbasekaran et al. | ....... 528/394 |
| 5,969,376 A | 10/1999 | Bao | ............................. 257/40 |
| 6,107,117 A | 8/2000 | Bao et al. | ..................... 438/99 |
| 6,150,191 A | 11/2000 | Bao | ............................. 438/99 |
| 6,320,200 B1 | * 11/2001 | Reed et al. | |
| 6,621,099 B2 | * 9/2003 | Ong et al. | ..................... 257/40 |

OTHER PUBLICATIONS

Beng S. Ong et al., U.S. Appl. No. 10/042,358 on Polythiophenes and Devices Thereof, filed Jan. 11, 2002.
Beng S. Ong et al., U.S. Appl. No. 10/042,342 on Polythiophenes and Devices Thereof, filed Jan. 11, 2002.
Beng S. Ong et al., U.S. Appl. No. 10/042,356 on Polythiophenes and Devices Thereof, filed Jan. 11, 2002.
Beng S. Ong et al., U.S. Appl. No. 10/042,357 on Polythiophenes and Devices Thereof, filed Jan. 11, 2002.
Beng S. Ong et al., U.S. Appl. No. 10/042,359 on Polythiophenes and Devices Thereof, filed Jan. 11, 2002.
Beng S. Ong et al., U.S. Appl. No. 10/042,360 on Polythiophenes and Devices Thereof, filed Jan. 11, 2002.

* cited by examiner

*Primary Examiner*—Duc Truong
(74) *Attorney, Agent, or Firm*—Eugene O. Palazzo; Fay, Sharpe, Fagan, Minnich & McKee, LLP

(57) ABSTRACT

An electronic device containing a polythiophene prepared by a metal halide-mediated coupling polymerization in an appropriate solvent, and which polythiophene is comprised of at least one monomer unit selected from the group consisting of 2,5-thienylene (or 2,5-thiophenediyl) (I), 2,5-thienylene (or 2,5-thiophenediyl) (II), and a divalent linkage D

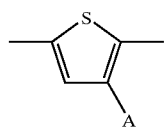

(I)

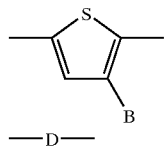

(II)

—D— wherein, for example, A is alkyl, alkoxy or derivatives thereof; B is a hydrogen atom, a small substituent like alkyl or alkoxy.

37 Claims, 2 Drawing Sheets

POLYTHIOPHENES AND DEVICES THEREOF

COPENDING APPLICATIONS

Illustrated in copending applications U.S. Ser. No. 10/042,342, U.S. Ser. No. 10/042,356, U.S. Ser. No. 10/042,357, U.S. Ser. No. 10/042,358, U.S. Ser. No. 10/042,359, U.S. Ser. No. 10/042,360, all titled "Polythiophenes and Devices Thereof" and all filed Jan. 11, 2002; and U.S. Ser. No. 10/231,841, filed Aug. 29, 2002 on "Polythiophenes and Devices Thereof", the disclosures of which are totally incorporated herein by reference, are, for example, polythiophenes and devices thereof.

Illustrated in U.S. Ser. No. 10/392,633, filed concurrently herewith on Fluorinated Polythiophene and Devices Thereof, the disclosure of which is totally incorporated herein by reference is a polythiophene comprising a repeating segment of the formula

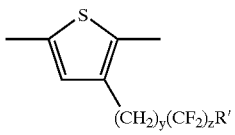

wherein R' is $CF_3$, alkyl or alkoxy; and y and z represent the number of repeating segments; and in U.S. Ser. No. 10/392,639, filed concurrently herewith on Fluorinated Polythiophene and Devices Thereof, the disclosure of which is totally incorporated herein by reference, is an electronic device comprised of a polythiophene

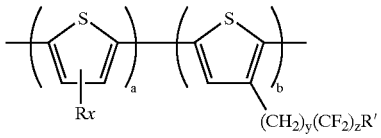

(I)

wherein R is an alkyl or alkoxy; x represents the number of R groups; R' is $CF_3$, alkoxy or alkyl; y and z represent the number of segments; and a and b are the mole fractions of each moiety, respectively, wherein the sum of a+b is equal to about 1.

The appropriate components, processes thereof and uses thereof illustrated in these copending applications may be selected for the present invention in embodiments thereof.

BACKGROUND

The present invention is generally directed to the preparation of polythiophenes and uses thereof. More specifically, the present invention in embodiments is directed to processes for the generation of polythiophenes, particularly solution processable polythiophenes, which are useful as active components in microelectronic devices. Of specific interest in embodiments of the present invention are polythiophene processes, which utilize metal halide-mediated oxidative coupling polymerization.

A number of certain polythiophenes are known which may be useful as conductive or semiconductor materials in electronic device such as thin film transistors, photovoltaic cells, organic/polymer light emitting diodes, and the like. Particularly useful polythiophenes are those which are soluble in organic solvents, and can thus be processed into microelectronic components by solution processes, such as spin coating, solution casting, dip coating, screen printing, stamp printing, jet printing and the like, thereby lowering the manufacturing cost of microelectronic devices. Specifically, certain polythiophenes, which contain repeating 2,5-thienylene (also known as 2,5-thiophendiyl) units possessing long side-chains, such as alkyl, arranged in a regioregular manner on the polythiophene backbone, may be suitable for these applications. The long alkyl side-chains, while imparting enhanced solubility characteristics to the polythiophenes, may also help induce and facilitate molecular self-organization when they are positioned in a regioregular manner on the polymer backbones. In a condensed phase, such as in thin films, molecular self-organization of polymer molecules under appropriate conditions permits ordered microstructure domains, and which molecules when present in the charge transport layers of microelectronic devices could enhance their electrical performance. For example, for the polythiophene semiconductor channel layers in thin film transistors, the presence of the lamellar π-stacking microstructures has been known to lead to superior field-effect transistor properties.

Thin film transistors, which utilize solution processable organic/polymer materials and polymer composites, may also be fabricated on plastic substrates to permit low cost lightweight structurally flexible integrated circuits which may be mechanically more robust and durable. These flexible lightweight integrated circuits are useful for incorporation into electronic devices, such as large-area image sensors, electronic paper and other display media where lightweight characteristics and device structural flexibility may be very appealing. These integrated circuit elements may also find use in low-end microelectronics, such as smart cards, radio frequency identification (RFID) tags, and memory/storage devices which require mechanical durability for extended life. For these applications, the performance of the polymer semiconductor materials, such as the polythiophenes in the channel layer, is of value. Also, while different synthetic methodologies and reaction conditions may provide analytically similar polythiophenes, the electrical performance of these polythiophenes, particularly their field-effect transistor characteristics when used as semiconductor channel materials in thin film transistor devices, may be dissimilar, for example there may be variations in the field-effect.

REFERENCES

Certain polythiophenes have been reported for use as semiconductor materials in thin film field-effect transistors. One known example is a regioregular poly(3-alkylthiophene), see for example reference Z. Bao et al., "Soluble and processable regioregular poly(3-hexylthiophene) for field-effect thin film transistor application with high mobility", *Appl. Phys. Lett.* Vol. 69, p4108 (1996). The use of polymer semiconductors, such as polythiophenes, as the semiconductor channel layers has enabled the fabrication of flexible transistors on plastic substrates. Polythiophenes can be prepared by many synthetic procedures depending specifically on the nature of the desired polythiophenes structures. A recent review of the chemistry and synthesis of polythiophenes was published by Richard D. McCullough, see reference R. D. McCullough, *Adv. Mater.* Vol. 10, p. 93 (1988). Of all the preparative procedures for soluble polythiophenes, such as poly(alkylthiophenes), one synthetic methodology is the metal halide-mediated oxidative coupling polymerization, reported by R. Sugimoto, see K. Yoshino, S. Hayashi, R. Sugimoto, "Preparation and Properties of Conducting Heterocyclic Polymer Films by Chemical Method" *Jpn J. Appl. Phys.* Vol. 23, p. L899 (1984), and R. Sugimoto, S. Takeda, H. B. Gu, and K. Yoshino, "Preparation of soluble Polythiophene derivatives utilizing transition metal halides as catalysts and their property", *Chem. Express*, Vol. 1, p. 635, (1986). In this method, alkylthiophene is usually treated with $FeCl_3$ in chloroform under a blanket of dry air, or with a slow stream of dry air or inert gas bubbling through the reaction medium to drive off the generated HCl for a period of from a few hours to days. A detailed study of this polymerization was also reported by Leclerc, see reference M. Leclerc, F. M. Diaz, G. Wegner, "Structural analysis of poly(3-alkylthiophene)s" *Makromol. Chem.* Vol. 190, p. 3105 (1989). While this methodology may be useful, it was reported as lacking in reproducibility, for example, irreproducibility in the preparation of poly(3-alkylthiophene)s via $FeCl_3$-mediated polymerization in chloroform, see M. Pomerantz, J. J. Tseng, H. Zhu, S. J. Sproull, J. R. Reynolds, R. Uitz, H. Arnott, H. I. Haider, "Processable Polymers and Copolymers of 3-Alkylthiophenes and Their Blends", *Synthetic Metals*, Vol. 41–43, p. 825 (1991).

Polythiophenes prepared with chloroform and other reaction media, such as for example, toluene, carbon tetrachloride, pentane, hexane, and the like, are illustrated in, for example, V. M. Niemi, P. Knuuttila, J.-E. Osterholm, and J. Korvola, *Polymer*, "Polymerization of 3-Alkylthiophens with $FeCl_3$", Vol. 33, p. 1559 (1992) and J. Kowalik, L. M. Tolbert, S. Narayan, and A. S. Abhiraman, "Electrically Conducting Poly(undecylbithiophene)s. 1. Regioselective Synthesis and Primary Structure", *Macromolecules*, Vol. 34, p. 5471 (2001).

Also, of interest may be U.S. Pat. Nos. 6,150,191; 6,107,117; 5,969,376; 5,619,357, and 5,777,070.

FIGURES

Illustrated in FIGS. 1 to 4 are various representative embodiments of the present invention, and wherein polythiophenes prepared as illustrated herein are selected as the channel materials in thin film transistor devices.

SUMMARY AND EMBODIMENTS

It is a feature of the present invention to provide semiconductor polymers, such as polythiophenes, which are useful for electronic device applications.

It is another feature of the present invention to provide processes for polythiophenes, which are useful for electronic devices.

It is a further feature of the present invention to provide processes for polythiophenes, which are useful for thin film transistor applications.

Additionally, a feature of the present invention is to provide processes for generating electrically acceptable polythiophenes, and which polythiophenes when used as semiconductor channel materials in thin film transistors, provide a mobility of from about $10^{-3}$ to about $10^{-1}$ cm²/V.sec and high current on/off ratio of from about equal to and over $10^5$ such as, for example, from about $10^5$ and about $10^8$ even for thin film transistor devices fabricated in ambient conditions.

In yet a further feature of the present invention there are provided processes for polythiophenes which are useful as electronic components, and which polythiophenes have reasonable solubility of, for example, at least about 0.1 percent by weight in some common organic solvents, such as chloroform, chlorobenzene, dichlorobenzene, tetrahydrofuran, toluene xylene, mesitylene, nitrobenzene, benzonitrile, chloronaphthalene, and the like, and thus these polythiophenes can be fabricated as active components of microelectronic devices by economical solution processes such as spin coating, screen printing, stamp printing, dip coating, solution casting, jet printing, and the like.

Moreover, another feature of the present invention resides in providing processes for polythiophenes for microelectronic devices, such as thin film transistors, and which polythiophenes when fabricated as active layers have a conductivity of from about $10^{-5}$ to about $10^{-9}$ S/cm (Siemens/centimeter).

Also, in yet another feature of the present invention there are provided polythiophenes with unique structural features, and which polythiophenes are prepared via a ferric chloride ($FeCl_3$)-mediated coupling polymerization in certain halogenated aromatic solvents or tetrahydronaphthalene.

These and other features of the present invention can be accomplished in embodiments by providing metal halide polymerization processes accomplished in a number of aromatic solvents under appropriate conditions. Specifically, the present invention in embodiments relates to processes for generating solution processable polythiophenes which are useful as microelectronic applications, and which polythiophenes contain one or a combination of repeating units selected from the group consisting of 2,5-thienylene (or 2,5-thiophenediyl) (I), 2,5-thienylene (or 2,5-thiophenediyl) (II), and a divalent linkage, D

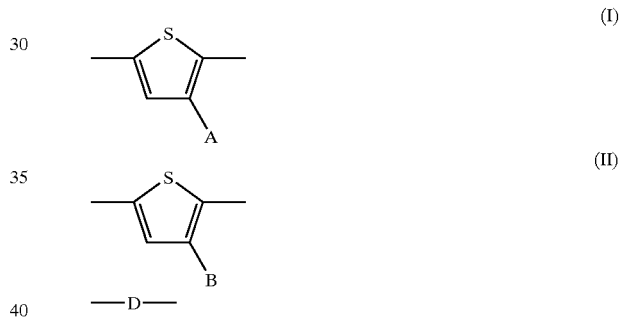

wherein, for example, A is a long side-chain comprising, for example, alkyl, alkyl derivatives, alkoxy, and the like, such as alkoxyalkyl; siloxyalkyl, perhaloalkyl, polyether, and the like; B is hydrogen atom or a substituent, such as for example, methyl, ethyl, methoxy, ethoxy, bromo, and the like; and D is selected, for example, from the group consisting of arylene with, for example, from about 6 to about 36 carbon atoms, such as phenylene, biphenylene, phenanthrenylene, dihydrophenanthrenylene, fluorenylene, oligoarylene, methylene, polymethylene, dialkylmethylene, dioxyalkylene, dioxyarylene, oligoethylene oxide, and the like. The long side-chain, A, is preferably one that contains, for example, from about 5 to about 25 atoms, and the small substituent, B, contains from 1 to about 3 carbon atoms. Illustrative examples of A of the 2,5-thienylene moiety (I) include alkyl with, for example, from about 1 to about 25 carbon atoms, and more specifically, from about 5 to about 12 carbon atoms, such as pentyl, hexyl, heptyl, octyl, nonyl, decyl, undecyl, dodecyl, isomeric forms thereof, mixtures thereof, and the like; alkoxy and alkoxyalkyl with, for example, from about 5 to about 25 carbon atoms, such as for example pentyloxy, hexyloxy, heptyloxy, ocytyloxy, methoxybutyl, methoxybutoxy, methoxyhexyl, methoxyheptyl, and the like; and polyether chains, such as polyethylene oxide; perhaloalkyl, such as perfluoroalkyl, and the like.

More specifically, in embodiments of the present invention, the polythiophenes, which can be obtained from the monomer segment of Formula (III)

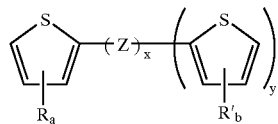

wherein R is alkyl, alkoxy, or derivatives thereof of, for example, from about 1, and more specifically, about 5 to about 25 carbon atoms; R' is hydrogen, halogen, alkyl, alkoxy, or the derivatives thereof of, for example, from about 1 to about 25 carbon atoms in length; a and b represent the number of segments, and for example, are independently 1 or 2; Z is a divalent conjugated linkage which may also contain substituted and/or nonsubstituted 2,5-thienylene (or 2,5-thiophenediyl) moieties, and other aromatic units such as arylene, furandiyl, pyrrolediyl, pyridinediyl, benzofurandiyl, dibenzofurandiyl, benzothiophenediyl, dibenzothiophenediyl, carbazolediyl, and the like; and x and y represent the number of segments, such as for example, a number of from 0 to about 3.

The number average molecular weight ($M_n$) of the polythiophenes can be, for example, from about 2,000 to about 100,000, and more specifically, from about 4,000 to about 50,000, and the weight average molecular weight ($M_w$) thereof can be from about 4,000 to about 500,000, and more specifically, from about 5,000 to about 100,000 both as measured by gel permeation chromatography using polystyrene standards.

Aspects of the present invention relate to polythiophenes and processes thereof, and which polythiophenes are useful as active materials for microelectronic devices, and in particular as semiconductor channel materials in thin film transistors; processes for the preparation of polythiophenes of Formula (IV), and which polythiophenes are suitable for use as semiconductor layers in thin film transistors

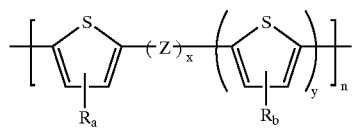

wherein R is a suitable substituent, such as alkyl, alkoxy, or derivatives thereof of, for example, from about 5 to about 25 carbon atoms; R' is a suitable substituent, such as hydrogen, halogen, alkyl, alkoxy, or derivatives thereof of, for example, from about 1 to about 25 carbon atoms in length; a and b represent the number of R groups, and are, for example, independently 1 or 2; Z is a divalent conjugated linkage which may also contain substituted and/or non-substituted 2,5-thienylene (or 2,5-thiophenediyl) moieties, and other aromatic units such as arylene, furandiyl, pyrrolediyl, pyridinediyl, benzofurandiyl, dibenzofurandiyl, benzothiophenediyl, dibenzothiophenediyl, dialkylaminoarylene, carbazolediyl, and the like; x and y represent the number of segments, and for example, are each from 0 to about 3; and n is the degree of polymerization; the number average molecular weight ($M_n$) of the polythiophenes can be, for example, from about 2,000 to about 100,000, and more specifically, from about 4,000 to about 50,000, and the weight average molecular weight ($M_w$) thereof can be from about 4,000 to about 500,000, and more specifically, from about 5,000 to about 100,000 both as measured by gel permeation chromatography using polystyrene standards; a device containing a polythiophene of the formula illustrated herein, and wherein when a and/or b equal to 2, reference substituent R or R' may form a cyclic structure with the thienylene ring, see for example illustrative Formulas (17) and (18); a thin film transistor device comprised of a substrate, a gate electrode, a gate dielectric layer, a source electrode and a drain electrode, and in contact with the source/drain electrodes and the gate dielectric layer, a semiconductor layer comprised of polythiophene (IV), and wherein R is alkyl with about 5 to about 25 carbon atoms, R' is hydrogen, halogen, alkyl, alkoxy, or derivatives thereof of from about 1 to about 25 carbon atoms; a and b are 1; Z contains one or more 2,5-thienylene rings and/or arylene rings, and n is 0 or 1; a thin film transistor device containing a semiconductor polythiophene (IV) prepared by the aromatic solvent processes illustrated herein, and which polythiophene has a number average molecular weight ($M_n$) of from about 2,000 to about 100,000; a weight average molecular weight ($M_w$) of from about 4,000 to over 500,000, both $M_w$ and $M_n$ being measured by gel permeation chromatography using polystyrene standards; a polythiophene containing device wherein R and/or R' is alkyl containing from 6 to about 15 carbon atoms; $M_n$ is from about 4,000 to about 50,000, and $M_w$ is from about 5,000 to about 100,000; a polythiophene containing device wherein the alkyl side chain R and/or R' contains from 6 to about 12 carbon atoms; a polythiophene containing device wherein R is selected from pentyl, hexyl, heptyl, octyl, nonyl, decyl, undecyl, or dodecyl, and R' is selected from hydrogen, methyl, ethyl, methoxy, ethoxy, and propyl; a device wherein Z contains one or more substituted and/or non-substituted 2,5-thienylene rings; a device of the formulas illustrated herein wherein Z contains aromatic rings selected from the group consisting of 2,5-thienylene, 3-alkyl-2,5-thienylene, 3,4-dialkyl-2,5-thienylene, phenylene, alkylphenylene, dialkylphenylene, alkoxyphenylene, dialkoxyphenylene, biphenylene, phenanthrenylene, 9,10-dihydrophenanthrenylene, fluorenylene, and the like; a thin film transistor containing a polythiophene prepared with a chlorinated aromatic solvent, such as chlorobenzene, dichlorobenzene, trichlorobenzene, and chloronaphthalene; a thin film transistor containing a polythiophene prepared in tetrahydronaphthalene; a thin film transistor containing a polythiophene prepared in chlorobenzene, or dichlorobenzene; a device containing a polythiophene prepared in a chlorinated aromatic solvent and which polythiophene has a $M_n$ of from about 2,000 to about 50,000, and a $M_w$ of from about 4,000 to about 100,000; a polythiophene containing device wherein the polythiophene possesses a $M_n$ of from about 2,000 to about 100,000, and a $M_w$ of from about 4,000 to about 200,000; a polythiophene containing device wherein the polythiophene prepared in a chlorinated aromatic solvent or tetrahydronaphthalene is selected from the group consisting of Formulas (1) to (21), and wherein n represents the number of segments, such as a number of from about 10 to about 1,000

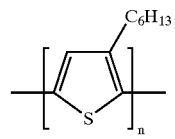

(1)

(2)
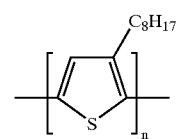
(3)
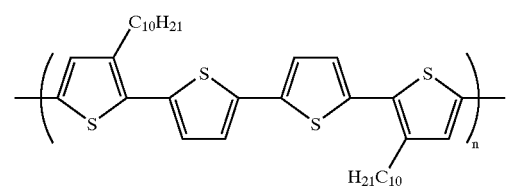
(4)
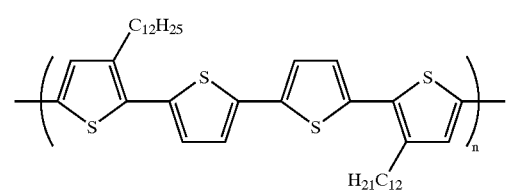
(5)
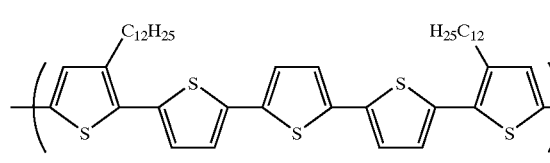
(6)
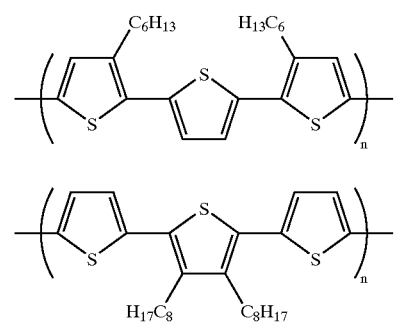
(7)
(8)
(9)
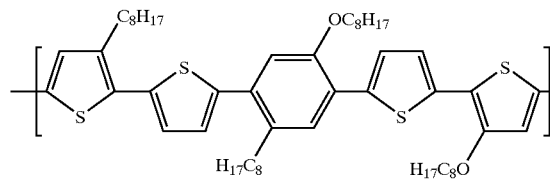
(10)
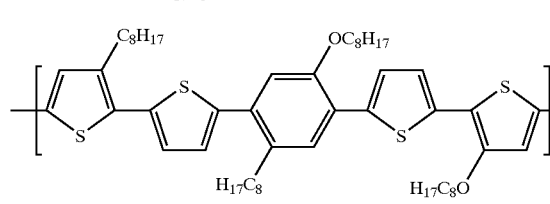
(11)
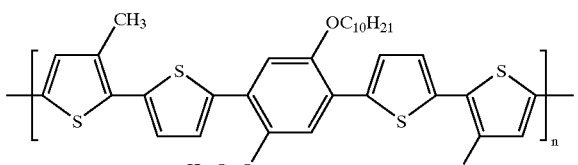
(12)
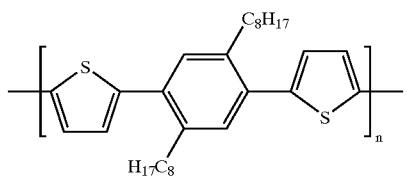
(13)
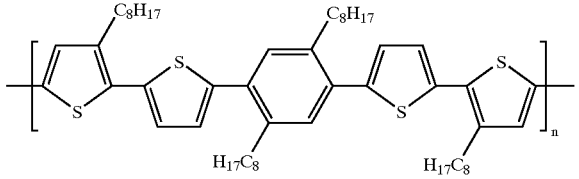
(14)
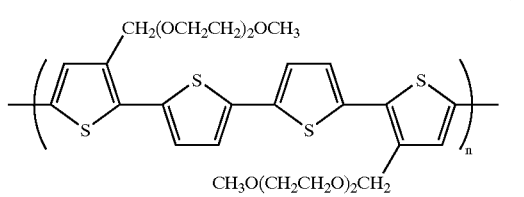
(15)
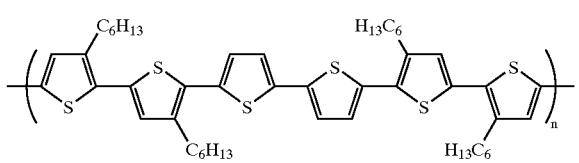
(16)
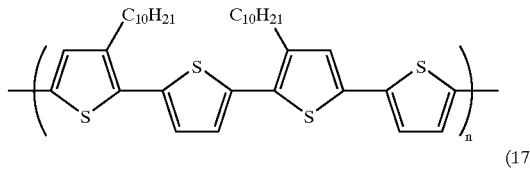
(17)
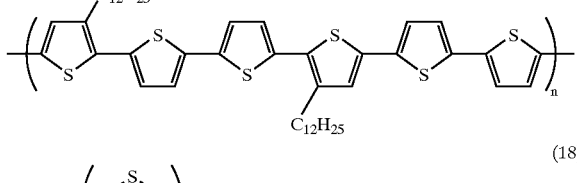
(18)
(19)
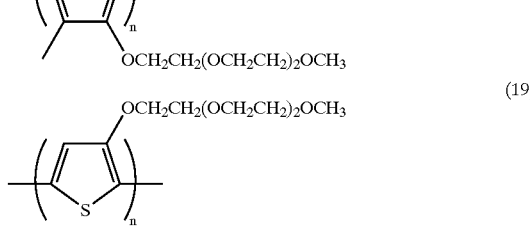

-continued

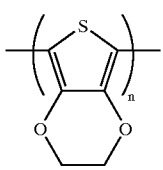
(20)

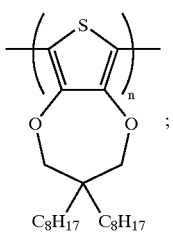
(21)

a thin film transistor device wherein the polythiophene is selected from the group consisting of Formulas (3) to (14), and wherein n represents the number of segments, such as from about 10 to about 1,000,

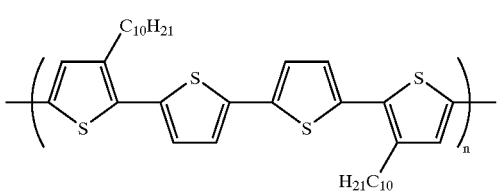
(3)

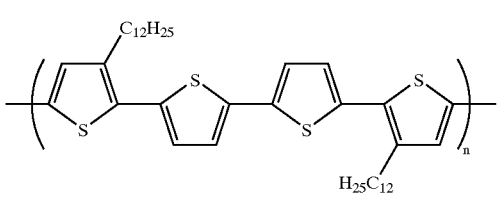
(4)

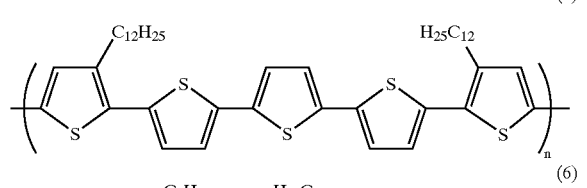
(5)

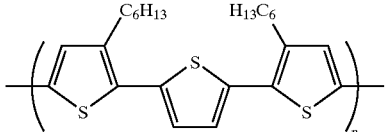

(6)

-continued

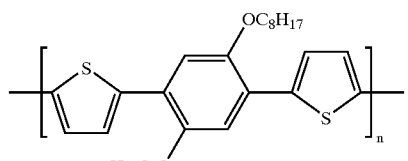
(9)

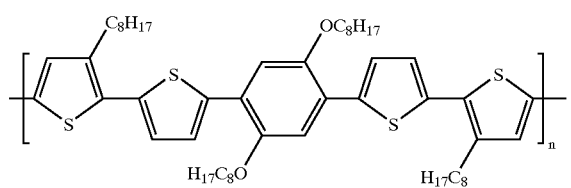
(10)

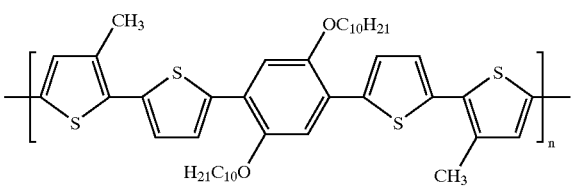
(11)

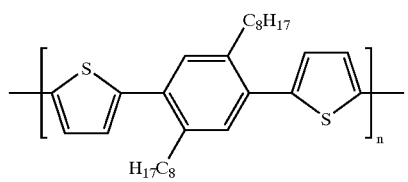
(12)

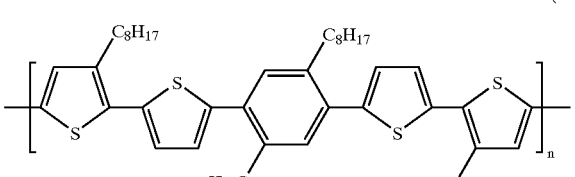
(13)

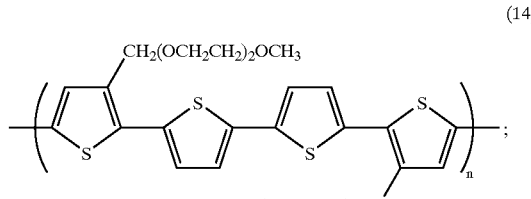
(14)

a device wherein the polythiophene is prepared in a suitable aromatic solvent, and which polythiophene is selected from the group consisting of Formulas (3) to (14), and wherein n is a number of from about 20 to about 500

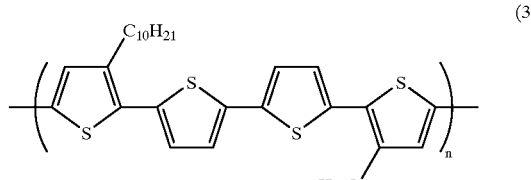
(3)

(4)
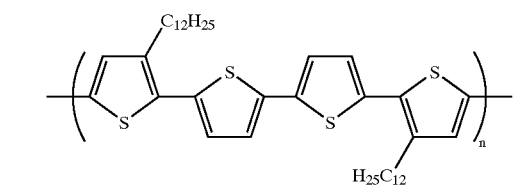
(5)
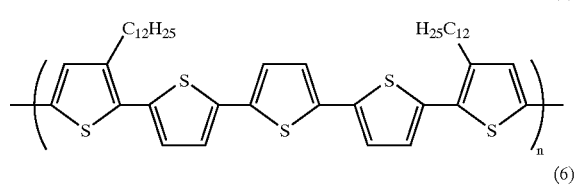
(6)
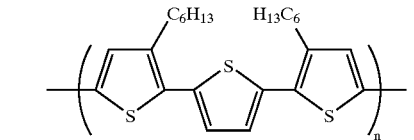
(7)
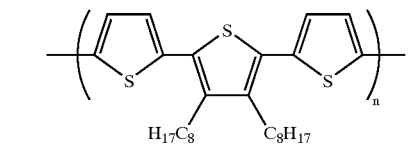
(8)
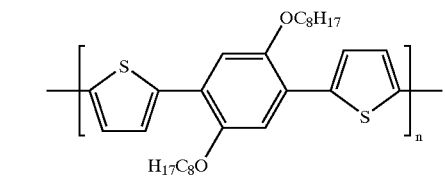
(9)
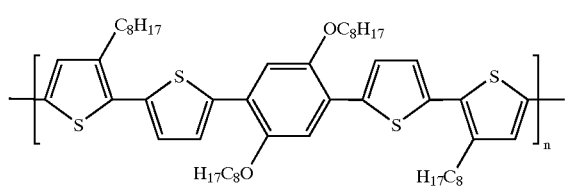
(10)
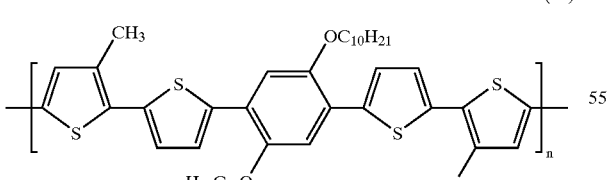
(11)
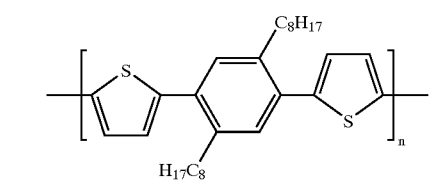
(12)
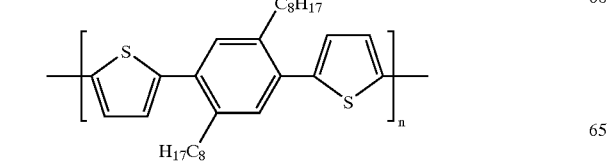
(13)
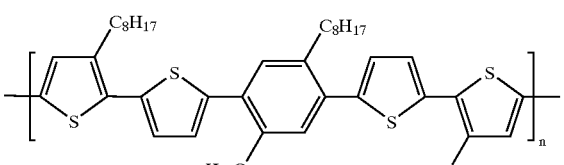
(14)
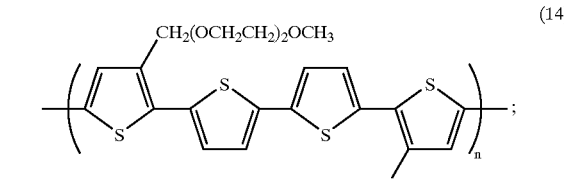
a device wherein the polythiophene is prepared in a chlorinated aromatic solvent, and which polythiophene is selected from the group consisting of Formula (3) to Formula (12), and wherein n is a number of from about 20 to about 100

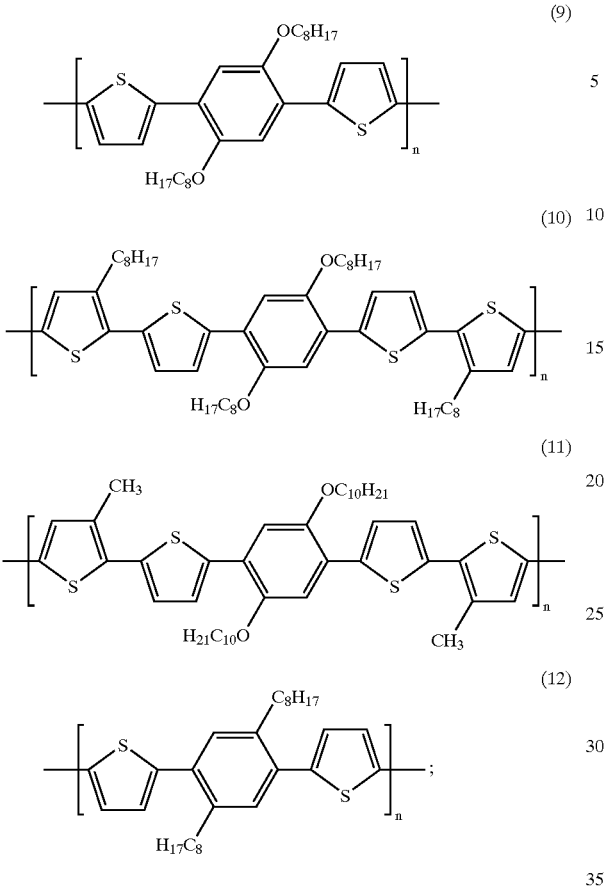
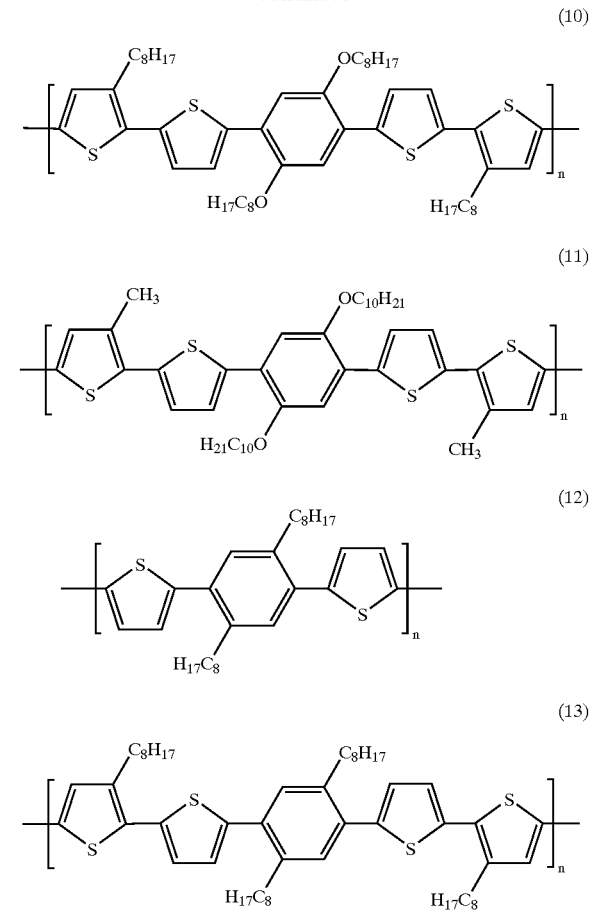

a device wherein the polythiophene is prepared in chlorobenzene, and which polythiophene is of Formulas (3), (4), (5), (10), (11), (12), (13), or (14) wherein n is as illustrated herein

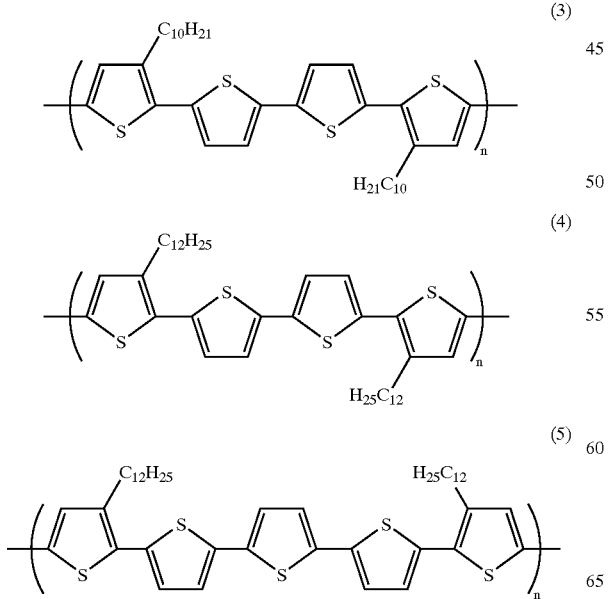

a device containing a polythiophene prepared by a metal halide polymerization in an aromatic solvent, and which polythiophene is comprised of one or more monomer units selected from the group consisting of a 2,5-thienylene segment (I), and a 2,5-thienylene segment (II)

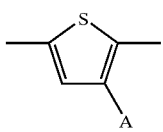

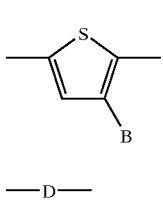

wherein A is alkyl, a halide, or alkoxy; B is a hydrogen atom, a halide, an alkyl or an alkoxy; and D is a divalent linkage for (I) and (II); an electronic device containing a polythiophene prepared by a metal halide-mediated coupling polymerization in a halogenated aromatic solvent or a hydronaphthalene, and which polythiophene is derived from a monomer segment of Formula (III)

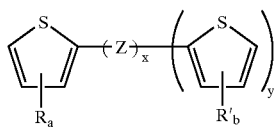 (III)

wherein R is alkyl or alkoxy; R' is hydrogen, alkoxy, halogen, or alkyl; a and b represent the number of R and R' substituents; Z is a divalent conjugated linkage, and x and y represent the number of segments; a device wherein the divalent linkage, Z, contains one or more segments selected from the group consisting of 2,5-thienylene, arylene, furandiyl, pyrrolediyl, pyridinediyl, benzofurandiyl, dibenzofurandiyl, benzothiophenediyl, dibenzothiophenediyl, dialkylaminoarylene, carbazolediyl, and the like; a thin film transistor containing a polythiophene of Formulas (1) to (18); a thin film transistor containing a polythiophene generated from the polymerization of a monomer of 3-alkylthiophene, 2,5-bis(2-thienyl)-3,4-dialkylthiophene, 2,5-bis(2-thienyl)-3,4-dialkoxythiophene, 2,5-bis(3-alkyl-2-thienyl)thiophene, 2,5-bis(3-alkoxy-2-thienyl)thiophene, 5,5'-bis(3-alkyl-2-thienyl)-2,2'-dithiophene, 5,5'-bis(3-alkoxy-2-thienyl)-2,2'-dithiophene, 1,4-bis(2-thienyl)-2,5-dialkylbenzene, 1,4-bis(2-thienyl)-2,5-dialkoxybenzene, 3,4-ethylenedioxythiophene, 3,4-(2,2-dialkylpropylene-1,3-dioxy)thiophene, or 3-methyl-4-alkoxythiophene; a thin film transistor wherein the substrate is a polyester, or a polycarbonate; the gate source and drain electrodes are each independently comprised of gold, nickel, aluminum, platinum, indium titanium oxide, or a conductive polymer, and the dielectric layer is comprised of silicon nitride or silicon oxide; a thin film transistor wherein the substrate is glass or a plastic sheet; the gate, source and drain electrodes are each comprised of gold, and the dielectric layer is comprised of the organic polymer poly(methacrylate), or poly(vinyl phenol); a device wherein the polythiophene layer is formed by solution processes of spin coating, stamp printing, screen printing, or jet printing; a device wherein the gate, source and drain electrodes, the dielectric, and semiconductor layers are formed by solution processes of spin coating, solution casting, stamp printing, screen printing, or jet printing; and a thin film transistor wherein the substrate is a polyester, or polycarbonate, the gate, source and drain electrodes are fabricated from the organic conductive polymer polystyrene sulfonate-doped poly(3,4-ethylene dioxythiophene) or from a conductive ink/paste compound of a colloidal dispersion of silver in a polymer binder, and the gate dielectric layer is an organic polymer or an inorganic oxide particle-polymer composite.

Specific illustrative polythiophene examples wherein n represents the number of repeating segments, such as from about 10 to about 1,000 in embodiments, are

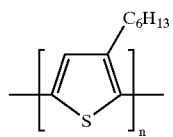 (1)

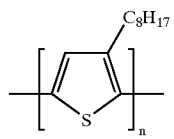 (2)

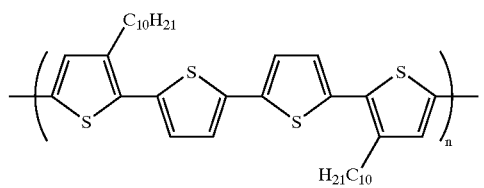 (3)

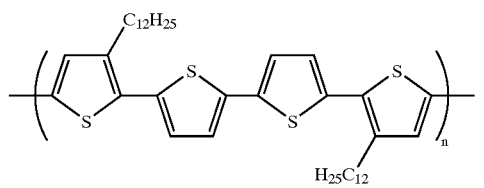 (4)

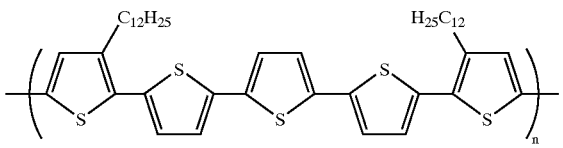 (5)

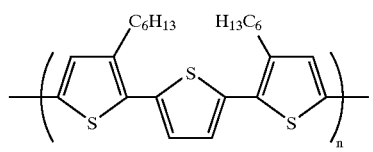 (6)

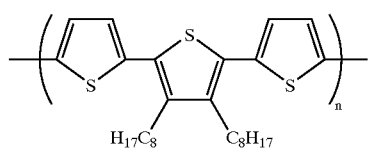 (7)

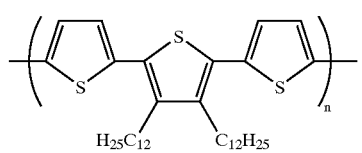 (8)

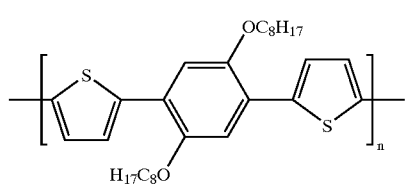 (9)

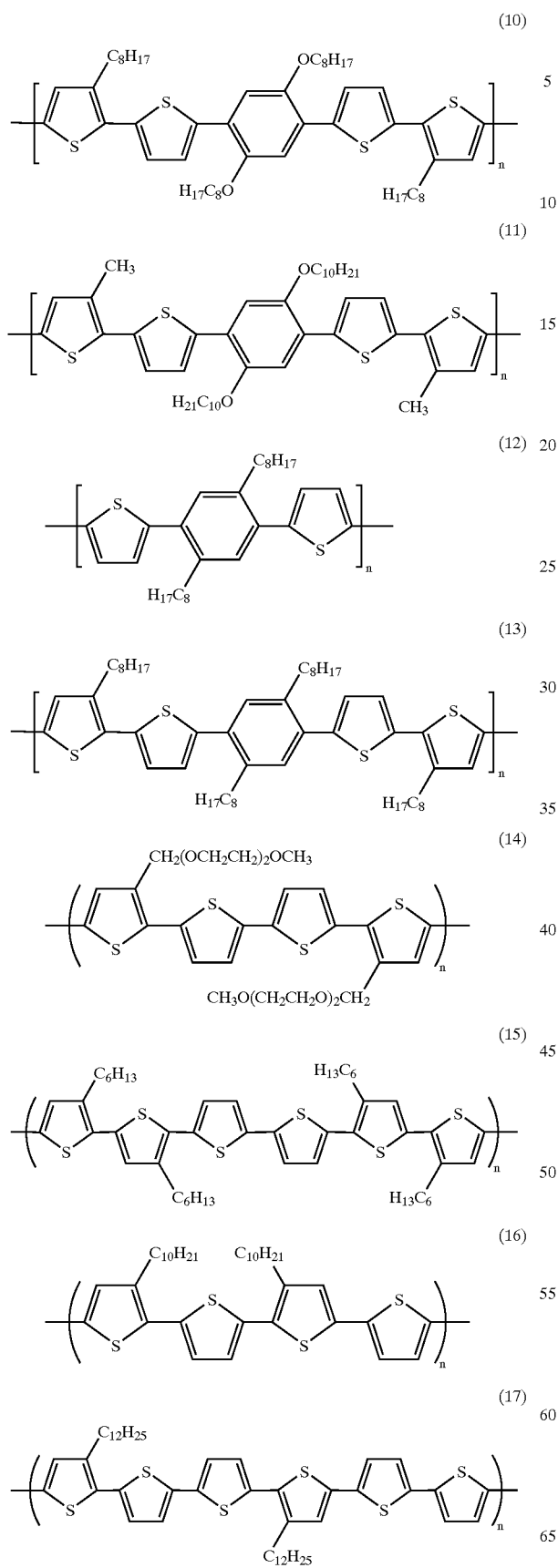
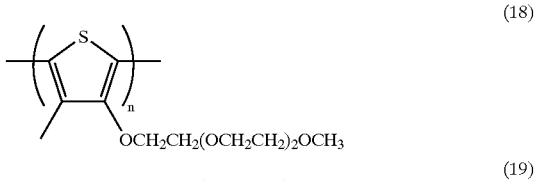
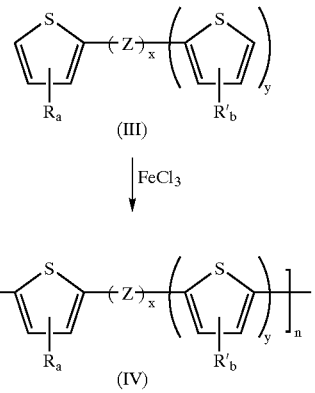

The polythiophenes in embodiments are prepared by the metal halide, such as a FeCl$_3$-mediated polymerization in a suitable reaction media under appropriate conditions according, for example, to the following scheme Scheme 1 wherein R, R', a, b, x, and y are as illustrated herein, and n is the degree or amount of polymerization.

More specifically, in embodiments of the present invention the polymerization is generally conducted by adding a solution of 1 molar equivalent of (III) in a halogenated aromatic solvent, such as chlorobenzene or dichlorobenzene, to a suspension of about 1 to about 5 molar equivalents of anhydrous FeCl$_3$ chlorobenzene. The resultant mixture is allowed to react at a temperature of about 25° C. to about 100° C. under a blanket of dried air, an inert gas, such as nitrogen or argon, or with a slow stream of dried air or inert gas bubbling through the reaction mixture for a suitable period of, for example, about 30 minutes to about 72 hours. After the aforementioned reaction, the reaction mixture can be washed sequentially with water and a dilute aqueous ammonium hydroxide solution, followed by washing with water, and then isolating the polythiophene product through precipitation by pouring its dilute solution thereof in a suitable solvent such as chlorobenzene into a stirred appropriate nonsolvent such as methanol or acetone. The polythiophene product is then subjected to soxhlet extraction with appropriate solvents such as methanol, hexane, heptane, toluene, xylene, tetrahydrofuran, chlorobenzene, and the like. The polythiophene, such as (IV), thus obtained can be further purified by precipitation from a suitable nonsolvent such as methanol or acetone.

Figure 1:
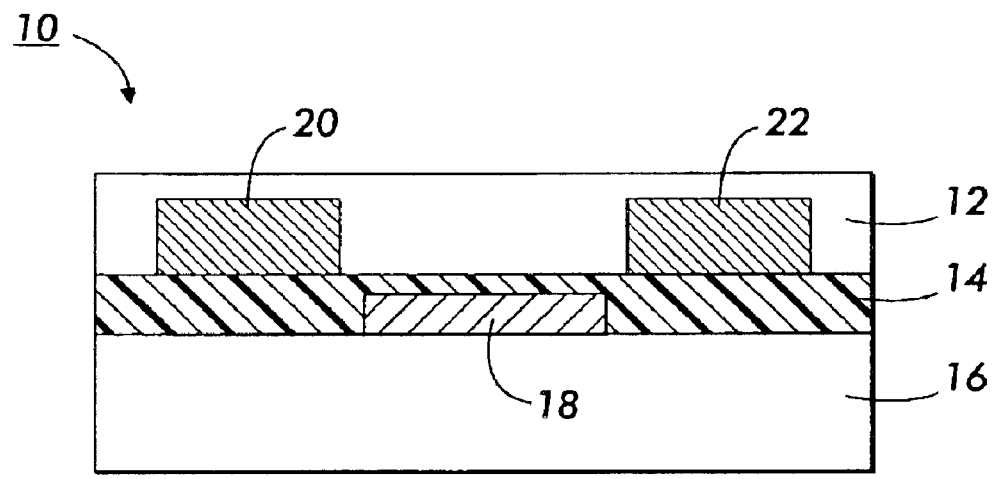
In FIG. 1 there is schematically illustrated a thin film transistor configuration 10 comprised of a substrate 16, in contact therewith a metal contact 18 (gate electrode), and a layer of an insulating dielectric layer 14 with the gate electrode having a portion thereof or the entire gate in contact with the dielectric layer 14, and situated on top of which layer 14 two metal contacts, 20 and 22 (source and drain electrodes). Over and between the metal contacts 20 and 22 is a polythiophene, as illustrated herein, semiconductor layer 12. The gate electrode can be included in the substrate, in the dielectric layer, and the like throughout.
Figure 2:
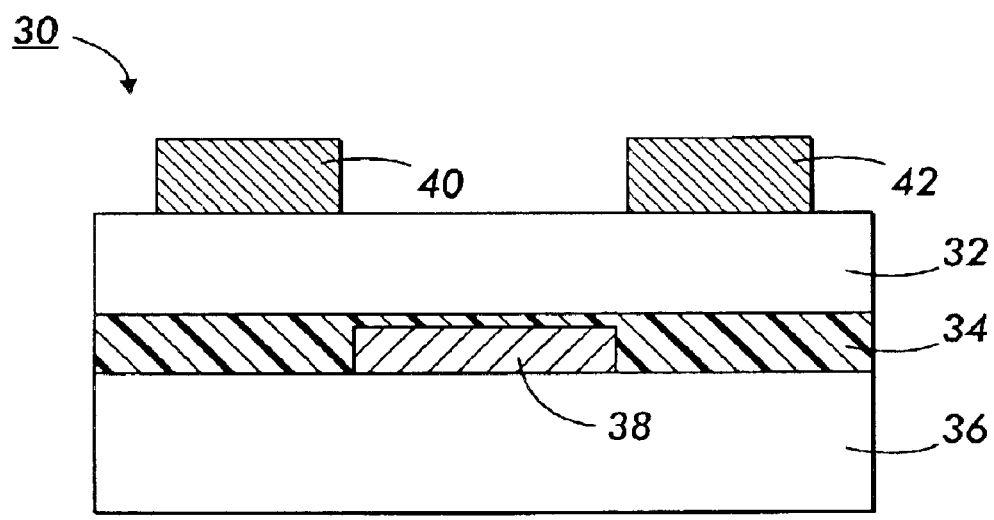
FIG. 2 schematically illustrates another thin film transistor configuration 30 comprised of a substrate 36, a gate electrode 38, a source electrode 40, a drain electrode 42, an insulating dielectric layer 34, and a polythiophene, as illustrated herein, semiconductor layer 32.

In embodiments of the present invention, an optional protecting layer, such as a suitable polymer like a polyester, may be incorporated on top of each of the transistor configurations of FIGS. 1, 2, 3 and 4. For the thin film transistor configuration of FIG. 4, the insulating dielectric layer 74 may also function as a protecting layer.

In embodiments and with further reference to the present invention and the Figures, the substrate layer may generally be a silicon material inclusive of various appropriate forms of silicon, a glass plate, a plastic film or a sheet, and the like depending on the intended applications. For structurally flexible devices, a plastic substrate, such as for example polyester, polycarbonate, polyimide sheets, and the like, may be selected. The thickness of the substrate may be, for example, from about 10 micrometers to over 10 millimeters with a specific thickness being from about 50 to about 100 micrometers, especially for a flexible plastic substrate, and from about 1 to about 10 millimeters for a rigid substrate such as glass or silicon.

The insulating dielectric layer, which can separate the gate electrode from the source and drain electrodes, and in contact with the semiconductor layer can generally be an inorganic material film, an organic polymer film, or an organic-inorganic composite film. The thickness of the dielectric layer is, for example, from about 10 nanometers to about 1 micrometer with a more specific thickness being about 100 nanometers to about 500 nanometers. Illustrative examples of inorganic materials suitable as the dielectric layer include silicon oxide, silicon nitride, aluminum oxide, barium titanate, barium zirconate titanate, and the like; illustrative examples of organic polymers for the dielectric layer include polyesters, polycarbonates, poly(vinyl phenol), polyimides, polystyrene, poly(methacrylate)s, poly(acrylate)s, epoxy resin, and the like; and illustrative examples of inorganic-organic composite materials include nanosized metal oxide particles dispersed in polymers such as polyester, polyimide, epoxy resin and the like. The insulating dielectric layer is generally of a thickness of from about 50 nanometers to about 500 nanometers depending on the dielectric constant of the dielectric material used. More specifically, the dielectric material has a dielectric constant of, for example, at least about 3, thus a suitable dielectric thickness of about 300 nanometers can provide a desirable capacitance, for example, of about $10^{-9}$ to about $10^{-7}$ F/cm$^2$.

Situated, for example, between and in contact with the dielectric layer and the source/drain electrodes is the active semiconductor layer comprised of the polythiophenes illustrated herein, and wherein the thickness of this layer is generally, for example, about 10 nanometers to about 1 micrometer, or about 40 to about 100 nanometers. This layer can generally be fabricated by solution processes such as spin coating, casting, screen, stamp, or jet printing of a solution of the polythiophenes of the present invention.

The gate electrode can be a thin metal film, a conducting polymer film, a conducting film generated from a conducting ink or paste, or the substrate itself (for example heavily doped silicon). Examples of gate electrode materials include but are not limited to aluminum, gold, chromium, indium tin oxide, conducting polymers, such as polystyrene sulfonate-doped poly(3,4-ethylenedioxythiophene) (PSS/PEDOT), a conducting ink/paste comprised of carbon black/graphite or colloidal silver dispersion contained in a polymer binder, such as ELECTRODAG® available from Acheson Colloids Company and silver filled electrically conductive thermoplastic ink available from Noelle Industries, and the like. The gate layer can be prepared by vacuum evaporation, sputtering of metals or conductive metal oxides, coating from conducting polymer solutions or conducting inks or dispersions by spin coating, casting or printing. The thickness of the gate electrode layer is, for example, from about 10 nanometers to about 10 micrometers, and a specific thickness is, for example, from about 10 to about 200 nanometers for metal films and about 1 to about 10 micrometers for polymer conductors.

The source and drain electrode layer can be fabricated from materials which provide a low resistance ohmic contact to the semiconductor layer. Typical materials suitable for use as source and drain electrodes include those of the gate electrode materials such as gold, nickel, aluminum, platinum, conducting polymers, and conducting inks. Typical thickness of this layer is about, for example, from about 40 nanometers to about 1 micrometer with the more specific thickness being about 100 to about 400 nanometers. The TFT devices contain a semiconductor channel with a width W and length L. The semiconductor channel width may be, for example, from about 10 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally, for example, about 0 volt to about −80 volts is applied to the drain electrode to collect the charge carriers transported across the semiconductor channel when a voltage of generally about +10 volts to about –80 volts is applied to the gate electrode.

Other known materials not recited herein for the various components of the TFT devices of the present invention can also be selected in embodiments.

The following Examples are provided.

GENERAL PROCEDURE

Figure 3:
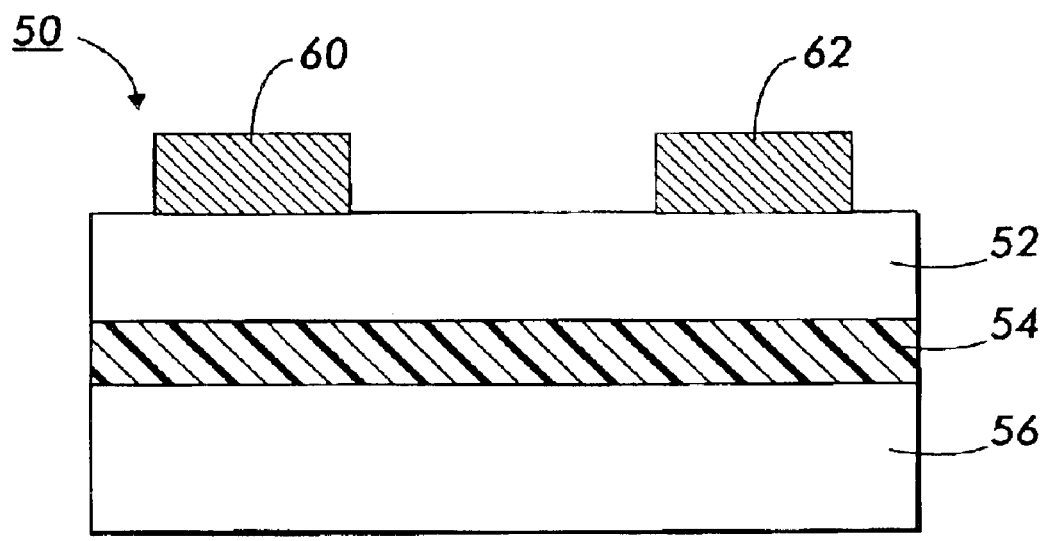
FIG. 3 schematically illustrates a further thin film transistor configuration 50 comprised of a heavily n-doped silicon wafer 56, which can act as a gate electrode, a thermally grown silicon oxide dielectric layer 54, a polythiophene semiconductor layer 52, as illustrated herein, on top of which are deposited a source electrode 60 and a drain electrode 62.
Figure 4:
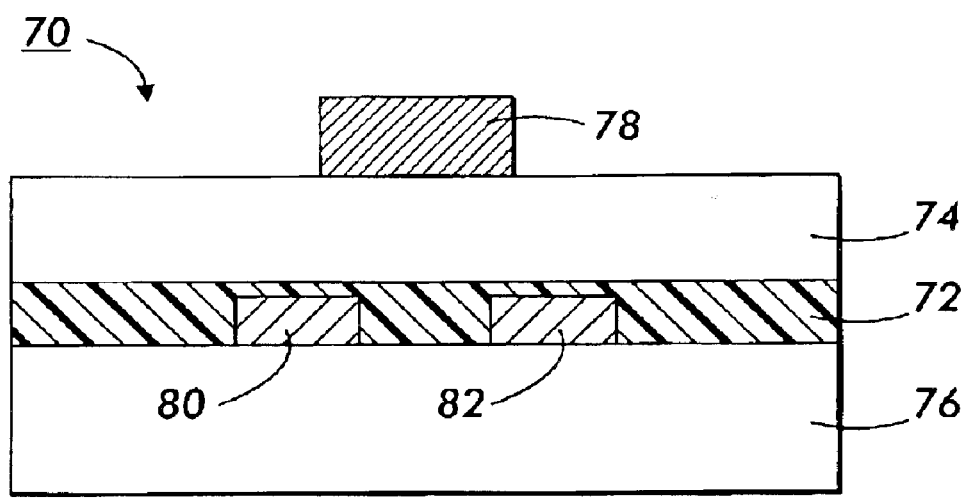
FIG. 4 schematically illustrates a thin film transistor configuration 70 comprised of substrate 76, a gate electrode 78, a source electrode 80, a drain electrode 82, a polythiophene semiconductor layer 72, as illustrated herein, and an insulating dielectric layer 74.

Device Fabrication:

There was selected a top-contact thin film transistor configuration as schematically illustrated, for example, in FIG. 3.

The device was comprised of an n-doped silicon wafer with a thermally grown silicon oxide layer of a thickness of about 110 nanometers thereon. The wafer functioned as the gate electrode while the silicon oxide layer acted as the gate dielectric and had a capacitance of about 32 $nF/cm^2$ (nanofarads/square centimeter). The fabrication of the device was accomplished under ambient conditions without any precautions being taken to exclude the materials selected and device from exposure to ambient oxygen, moisture, or light. The silicon wafer was first cleaned with methanol, air dried, and then immersed in a 0.01 M solution of octyltrichlorosilane in toluene for about 10 minutes at room temperature, about 23° C. to about 25° C. Subsequently, the wafer was washed with dichloromethane, methanol and air dried. A semiconductor polythiophene layer of about 30 nanometers to about 100 nanometers in thickness was then deposited on top of the silicon oxide dielectric layer by spin coating a solution of the polythiophene at a speed of 1,000 rpm for about 35 seconds, and followed by drying in vacuo at 80° C. for 20 hours. The solution used in fabricating the semiconductor layer was comprised of 1 percent by weight of the polythiophene in a selected solvent, and was filtered through a 0.2 $\mu$m filter before use. Thereafter, gold source and drain electrodes were deposited on top of the semiconductor polythiophene layer by vacuum deposition through a shadow mask with various channel lengths and widths, thus creating a series of transistors of various dimensions. Primarily for consistency issues, the fabricated devices were retained in a dry atmosphere of about 30 percent relative humidity in the dark before and after evaluation.

The performance of a number of the devices with certain polythiophenes may in embodiments be further improved by thermal annealing. This can be accomplished by first heating the devices in an oven to a temperature of about 100° C. to 150° C. for about 5 to about 15 minutes, and then cooling to room temperature, about 22° C. to about 25° C., before evaluation.

TFT Device Characterization:

The evaluation of the field-effect transistor performance was accomplished in a black box under ambient conditions using a Keithley 4200 SCS semiconductor characterization system. The carrier mobility, $\mu$, was calculated from the data in the saturated regime (gate voltage, $V_G$<source-drain voltage, $V_{SD}$) according to equation (1)

$$I_{SD}=C_i\mu(W/2L)(V_G-V_T)^2 \quad (1)$$

where $I_{SD}$ is the drain current at the saturated regime; W and L are, respectively) the semiconductor channel width and length; Ci is the capacitance per unit area of the gate dielectric layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}=0$.

Another property of a field-effect transistor is its current on/off ratio. This is the ratio of the saturation source-drain current when the gate voltage $V_G$ is equal to or greater than the drain voltage $V_D$ to the source-drain current when the gate voltage $V_G$ is zero.

COMPARATIVE EXAMPLE 1

Comparative Device with Polythiophene (4) Prepared in Chloroform

Synthesis: A solution of 2-bromo-3-dodecylthiophene (11.5 grams, 34.92 mmol) in 40 milliliters of anhydrous tetrahydrofuran (THF) was added slowly over a period of 20 minutes to a mechanically stirred suspension of magnesium turnings (1.26 grams, 51.83 mmol) in 10 milliliters of THF (tetrahydrofuran) in a 100 milliliter round bottom flask under an inert argon atmosphere. The resultant mixture was stirred at room temperature of about 22° C. to about 25° C. for 2 hours, and then at 50° C. for 20 minutes before cooling down to room temperature. The resultant mixture was then added via a cannula to a mixture of 5,5'-dibromo-2,2'-dithiophene (4.5 grams, 13.88 mmol) and [1,3-bis(diphenylphosphino]dichloronickel (II) (0.189 gram, 0.35 mmol) in 80 milliliters of anhydrous THF in a 250 milliliter round-bottomed flask under an inert atmosphere, and refluxed for 48 hours. Subsequently, the reaction mixture was diluted with 200 milliliters of ethyl acetate, was washed twice with water and with a 5 percent aqueous hydrochloric acid (HCl) solution, and dried with anhydrous sodium sulfate. A dark brown syrup, obtained after evaporation of the above solvent, was purified by column chromatography on silica gel yielding 5,5'-bis(3-dodecyl-2-thienyl)-2,2'-dithiophene as a yellow crystalline product in 55 percent yield, m.p. 58.9° C.

Polymerization of 5,5'-bis(3-dodecyl-2-thienyl)-2,2'-dithiophene was accomplished as follows:

A solution of 5,5'-bis(3-dodecyl-2-thienyl)-2,2'-dithiophene (0.50 gram, 0.75 mmol) in 10 milliliters of chloroform was added slowly over a period of about 5 minutes to a well stirred mixture of $FeCl_3$ (0.40 gram, 2.47 mmol) in 5 milliliters of chloroform in a 100 milliliter round-bottom flask in a dry atmosphere. The resultant mixture was heated at about 40° C. to about 60° C. for 24 hours under a blanket of dry air. After the polymerization, the mixture was diluted with 20 milliliters of methylene chloride and washed three times with water. The separated organic phase was stirred with 150 milliliters of a 7.5 percent aqueous ammonia solution for 30 minutes, washed with water until the water phase was clear, and then poured into methanol to precipitate the crude polythiophene. The final polythiophene product, which was purified by soxhlet extraction first with heptane, and then with chlorobenzene, evidenced the following molecular weight properties of $M_w$ 23,200; $M_n$ 15,300 relative to polystyrene standards.

Device Fabrication and Characterization: Thin film transistor devices were fabricated in accordance with the procedure described herein and using the polythiophene as prepared above with characteristics of W=5,000 $\mu$m and L=60 or 165 $\mu$m, resulting in the following average properties from at least five separate transistors:

| Mobility: | 0.009–0.02 cm$^2$/V · s |
| On/off ratio: | 1–5.1 × 10$^6$ |

The devices were thermally annealed by heating to a temperature of about 140° C. to about 145° C. in an oven for about 15 minutes and then cooling down to room temperature for evaluation. For these devices, thermal annealing provided poor thin film transistor performance such as lower mobility and current on/off ratio.

COMPARATIVE EXAMPLE 2

Comparative Devices with Polythiophene (4) Prepared in Toluene

Synthesis: Polythiophene (4) was prepared in accordance with the procedure of Comparative Example 1 except that the polymerization was conducted in toluene instead of chloroform. The final polythiophene product, which was purified by soxhlet extraction with heptane, and then chlorobenzene, indicated the following molecular weight properties of M$_w$ 4,500; M$_n$ 1800 relative to polystyrene standards.

Device Fabrication and Characterization: Thin film transistor devices were fabricated in accordance with the processes illustrated herein above. The following average properties were obtained for the device of Comparative Example 2:

| Mobility: | 2.1–4.5 × 10$^{-4}$ cm$^2$/V · s |
| On/off ratio: | 10$^3$–10$^4$ |

Thermal annealing of the devices as illustrated herein resulted in poor thin film transistor performance.

EXAMPLE I

Illustrative Devices with Polythiophene (4) Prepared in Chlorobenzene

Synthesis: Polythiophene (4) was prepared in accordance with the procedure of Comparative Example 1 except that the polymerization was conducted in chlorobenzene instead of chloroform. The final polythiophene product, which was purified by soxhlet extraction with heptane, and then chlorobenzene, showed the following molecular weight properties of M$_w$ 22,900; M$_n$ 17,300 relative to polystyrene standards.

Device Fabrication and Characterization: Thin film transistor devices were fabricated in accordance with the processes illustrated herein; reference Comparative Example 1. The following average properties were obtained:

| Mobility: | 0.015–0.04 cm$^2$/V · s |
| On/off ratio: | 2.5–7.1 × 10$^6$ |

Thermal annealing of the devices resulted in significant improvements by, for example, about 55 percent in thin film transistor performance:

| Mobility: | 0.05–0.12 cm$^2$/V · s |
| On/off ratio: | 0.9–4.7 × 10$^7$ |

Both the mobility and current on/off ratio of these devices, both before and after thermal annealing, were substantially higher by, for example, 45 percent than those of the comparative devices of Comparative Examples 1 and 2.

EXAMPLE II

Illustrative Devices with Polythiophene (4) Prepared in Dichlorobenzene

Synthesis: Polythiophene (4) was prepared in dichlorobenzene in accordance with the process of Comparative Example 1 except that dichlorobenzene was utilized instead of chloroform. The final polythiophene product, which was purified by soxhlet extraction with heptane, and then chlorobenzene, indicated the following molecular weight properties of M$_w$ 17,900; M$_n$ 11,800 relative to polystyrene standards.

Device Fabrication and Characterization: Thin film transistor devices were then fabricated in accordance with the processes of the above Examples. The following thin film transistor properties were obtained:

| Mobility: | 0.013–0.03 cm$^2$/V · s |
| On/off ratio: | 1.5–6 × 10$^6$ |

Thermal annealing of the devices resulted in excellent thin film transistor performance:

| Mobility: | 0.049–0.082 cm$^2$/V · s |
| On/off ratio: | 0.8–2 × 10$^7$ |

Both the mobility and current on/off ratio of these devices, both before and after thermal annealing, are higher, over 55 percent in embodiment, than those of the comparative devices of Comparative Examples 1 and 2.

COMPARATIVE EXAMPLE 3

Comparative Devices with Polythiophene (7) Prepared in Chloroform

Synthesis: 2 M octylmagnesium bromide (100 milliliters, 0.2 mol) in anhydrous ethyl ether was added to a well-stirred mixture of dichloro[1,3-bis(diphenylphosphino)-propane] nickel (II) (0.2 gram) and 3,4-dibromothiophene (20.16 grams, 0.0833 mol) in 200 milliliters of anhydrous ethyl ether in a 500 milliliter round bottom flask cooled with an ice bath under an inert atmosphere. The nickel complex (II) reacted immediately with the Grignard reagent, and the resulting reaction mixture was then allowed to warm up to room temperature. An exothermic reaction started within 30 minutes and the ethyl ether began to reflux gently. After stirring for another 2 hours at room temperature, the reaction mixture was refluxed for 6 hours, then cooled in an ice bath, and hydrolyzed with an aqueous 2N hydrochloric acid. The resulting organic layer was separated and washed successively with water, brine, and again with water, dried over anhydrous sodium sulfate, and filtered. After evaporation of the solvent, the residue was distilled under reduced pressure using a Kugelrohr apparatus to provide 21.3 grams of 3,4-dioctylthiophene as a colorless liquid.

$^1$H NMR (CDCl$_3$): δ 6.89 (s, 2H), 2.50 (t, J=7 Hz, 4H), 1.64–1.58 (m, 4H), 1.40–1.28 (m, 20H), 0.89 (t, J=6.5 Hz, 6H); $^{13}$C NMR (CDCl$_3$) δ 142.1, 119.8, 31.9, 29.6 (2C), 29.5, 29.3, 28.8, 22.7, 14.1.

N-bromosuccinimide (4.6 grams, 25.7 mmol) was added to a well-stirred solution of 3,4-dioctylthiophene (3.6 grams, 11.7 mmol) in a mixture of 30 milliliters of dichloromethane and 10 milliliters of acetic acid in a 100 milliliter round bottom flask. The reaction was monitored by thin layer chromatography and was complete in about 35 minutes. The resulting mixture was diluted with 160 milliliters of dichloromethane and filtered to remove succinimide. The filtrate was washed with aqueous 2N sodium hydroxide solution, and then twice with water (2×100 milliliters). After drying with anhydrous sodium sulfate and removal of the solvent, 5.4 grams of 2,5-dibromo-3,4-dioctylthiophene as a light yellow liquid was obtained.

$^1$H NMR (CDCl$_3$): δ 2.50 (t, J=7 Hz, 4H), 1.52–1.28 (m, 24H), 0.89 (t, J=6.5 Hz, 6H).

In a dry box under an inert atmosphere, Pd(PPh$_3$)$_2$Cl$_2$ (0.15 gram, 0.2 mmol) was added to a mixture of 2,5-dibromo-3,4-dioctylthiophene (4.2 grams, 9 mmol) and 2-(tributylstannyl)-thiophene (7.4 grams, 19.8 mmol) in anhydrous tetrahydrofuran (50 milliliters) in a 250 milliliter round bottom flask. The mixture was then refluxed for 12 hours and the solvent was removed by evaporation. The crude product thus obtained was purified by flash chromatography on silica gel using hexane as eluent to provide 3.1 grams of 2,5-bis(2-thienyl)-3,4-dioctylthiophene.

$^1$H NMR (CDCl$_3$): δ 7.31 (dd, J=3.2, 0.5 Hz, 2H), 7.13 (dd, J=2.2, 0.5 Hz, 2H), 7.06 (dd, J=2.2, 4.5 Hz, 2H), 2.68 (dd, J=7.6, 7.6 Hz, 4H), 1.59–1.53 (m, 4H), 1.42–1.27 (m, 20H), 0.91 (t, J=6.5 Hz, 6H).

The polymerization was accomplished in chloroform by the process of Comparative Example 1 except that 2,5-bis(2-thienyl)-3,4-dioctylthiophene was utilized instead of 5,5'-bis(3-dodecyl-2-thienyl)-2,2'-dithiophene. The final polythiophene product, which was purified by soxhlet extraction with ethyl acetate and chlorobenzene, indicated the following molecular weight properties of $M_w$ 49,100; $M_n$ 16,300 relative to polystyrene standards.

Device Fabrication and Characterization: Thin film transistor test devices were fabricated with polythiophene (8) as prepared above, with dimensions of W=5,000 μm and L=60 or 165 μm, and the following average properties from at least five separate transistors were obtained:

| Mobility: | 0.001–0.003 cm$^2$/V · s |
|---|---|
| On/off ratio: | 1.5–2.6 × 10$^5$ |

Thermal annealing of the devices in accordance with the procedure of Comparative Example 1 resulted in lower mobility and a poor current on/off ratio.

EXAMPLE III

Illustrative Devices with Polythiophene (7) Prepared in Chlorobenzene

Synthesis: Polythiophene (7) was prepared in accordance with the procedure of Comparative Example 3 except that the polymerization was conducted in chlorobenzene instead of chloroform. The final polythiophene, which was purified by soxhlet extraction with ethyl acetate and chlorobenzene, showed the following molecular weight properties of $M_w$ 45,400; $M_n$ 18,600 relative to polystyrene standards.

Device Fabrication and Characterization: Thin film transistor devices were fabricated with polythiophene (7) as prepared above in accordance with the procedure as described hereinbefore. Using the transistors with dimension of W=5,000 μm and L=60 or 165 μm, the following average properties from at least five separate transistors for each polythiophene are obtained:

| Mobility: | 0.006–0.01 cm$^2$/V · s |
|---|---|
| On/off ratio: | 0.8–2.1 × 10$^6$ |

Both the mobility and current on/off ratio of these devices are significantly higher, about 70 percent in embodiments, than those of the comparative devices of Comparative Example 3.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

What is claimed is:

1. A device containing a polythiophene prepared by a metal halide polymerization in an aromatic solvent, and which polythiophene has a number average molecular weight ($M_n$) of from about 2,000 to about 100,000, and a weight average molecular weight ($M_w$) of from about 4,000 to about 500,000, both as measured by gel permeation chromatography using polystyrene standards, and which polythiophene is comprised of at least one monomer unit comprising at least one of 2,5-thienylene segment (I), and at least one of 2,5-thienylene segment (II), and a divalent linkage D

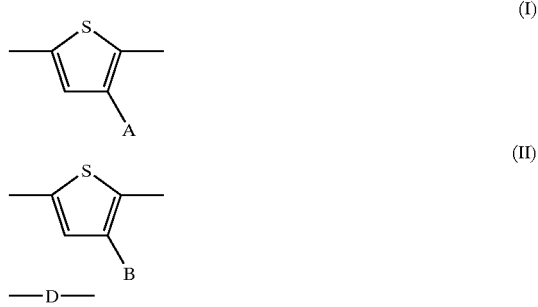

wherein A is alkyl or alkoxy; B is a halide; and D is a divalent linkage for said (I) and (II).

2. A device in accordance with claim 1 wherein said metal halide is ferric chloride, MoCl$_3$ or RuCl$_3$.

3. A device in accordance with claim 1 wherein said aromatic solvent is a halogenated solvent selected from the group consisting of bromobenzene, chlorobenzene, dichlorobenzene, trichlorobenzene, and chloronaphthalene.

4. A device in accordance with claim 1 wherein the solvent is tetrahydronaphthalene.

5. A device in accordance with claim 1 wherein A alkyl contains from about 5 to about 25 carbon atoms; B alkyl contains from 1 to about 3 carbon atoms; and D is arylene.

6. A device in accordance with claim 1 wherein said A is selected from the group consisting of pentyl, hexyl, heptyl, octyl, nonyl, decyl, undecyl, dodecyl, pentyloxy, hexyloxyl, heptyloxy, octyloxy, methoxybutyl, methoxybutoxy, methoxyhexyl, methoxyheptyl, and perfluoroalkyl; B is selected from the group consisting of methyl, ethyl, methoxy, ethoxy, and propyl; and D is selected from the group consisting of phenylene, biphenylene, phenanthrenylene, dihydrophenanthrenylene, fluorenylene, oligoarylene, methylene, polymethylene, dialkylmethylene, dioxyalkylene, dioxyarylene, and oligoethylene oxide.

7. An electronic device containing a polythiophene prepared by a metal halide-mediated coupling polymerization in a halogenated aromatic solvent or a hydronaphthalene, which polythiophene has a number average molecular weight ($M_n$) of from about 2,000 to about 100,000 and a weight average molecular weight ($M_w$) of from about 4,000 to about 500,000, both as measured by gel permeation chromatography using polystyrene standard, and which polythiophene is derived from a monomer segment of Formula (III)

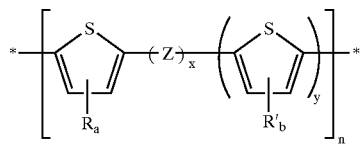

(III)

wherein R is alkyl or alkoxy; R' is alkoxy, halogen, or alkyl; a and b represent the number of R and R' substituents; Z is a divalent conjugated linkage; x and y represent the number of repeating units of their respective segment and x is greater than zero; and n is the degree of polymerization.

8. A device in accordance with claim 7 wherein said metal halide is ferric chloride, and said a and b are 1 or 2.

9. A device in accordance with claim 7 wherein said halogenated aromatic solvent is selected from the group consisting of bromobenzene, chlorobenzene, dichlorobenzene, trichlorobenzene, and chloronaphthalene.

10. A device in accordance with claim 7 wherein alkyl contains from about 1 to about 25 carbon atoms; x is from 1 to about 3, and y is from zero to about 3.

11. A device in accordance with claim 7 wherein the divalent linkage, Z, contains one or more segments selected from the group consisting of 2,5-thienylene, arylene, furandiyl, pyrrolediyl, pyridinediyl, benzofurandiyl, dibenzofurandiyl, benzothiophenediyl, dibenzothiophenediyl, dialkylaminoarylene, and carbazolediyl.

12. A device in accordance with claim 7 wherein the divalent linkage, Z, contains at least one substituted and/or non-substituted 2,5-thienylene segment.

13. A device in accordance with claim 7 wherein R is selected from the group consisting of pentyl, hexyl, heptyl, octyl, nonyl, decyl, undecyl, dodecyl, pentyloxy, hexyloxy, heptyloxy, octyloxy methoxybutyl, methoxybutoxy, methoxyhexyl, and methoxyheptyl; R' is selected from the group consisting of methyl, ethyl, methoxy, ethoxy, bromo, and propyl.

14. A device in accordance wit claim 7 wherein a=b=1, x is from 1 to about 3, and y is from zero to about 3.

15. A device in accordance with claim 7 wherein chlorobenzene or dichlorobenzene is selected as the solvent.

16. A device in accordance with claim 7 wherein tetrahydronaphthalene is selected as the solvent or the reaction medium for polymerization.

17. A device in accordance with claim 7 wherein the polymerization is conducted by heating at from about 40° C. to about 100° C. for an optional period of from about 30 minutes to about 72 hours.

18. A device in accordance with claim 7 wherein the number average molecular weight ($M_n$) of the polythiophene is from about 7,000 to about 30,000, and the weight average molecular weight ($M_w$) is from about 10,000 to about 100,000, both as measured by gel permeation chromatography using polystyrene standards.

19. An electronic device containing a polythiophene prepared by a metal halide-mediated coupling polymerization in a halogenated aromatic solvent or a hydronaphthalene, which polythiophene has a number average molecular weight ($M_n$) of from about 2,000 to about 100,000, and a weight average molecular weight ($M_w$) of from about 4,000 to about 500,000, both as measured by gel permeation chromatography using polystyrene standards, and wherein the polythiophene is alternatively of the Formulas (1) to (21), and wherein n represents the number of segments

(1)

(2)

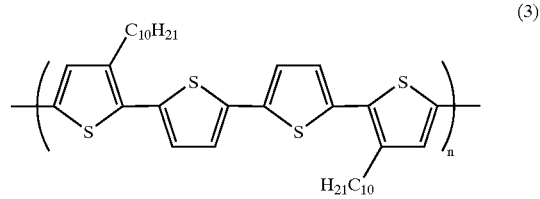

(3)

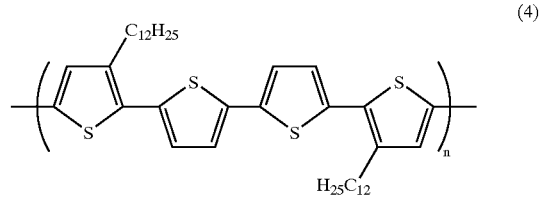

(4)

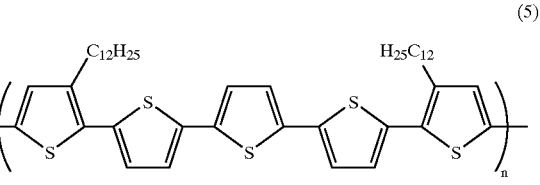

(5)

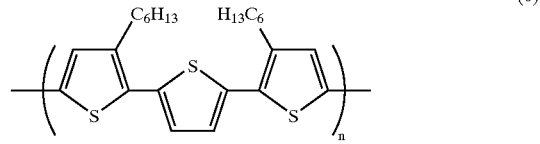

(6)

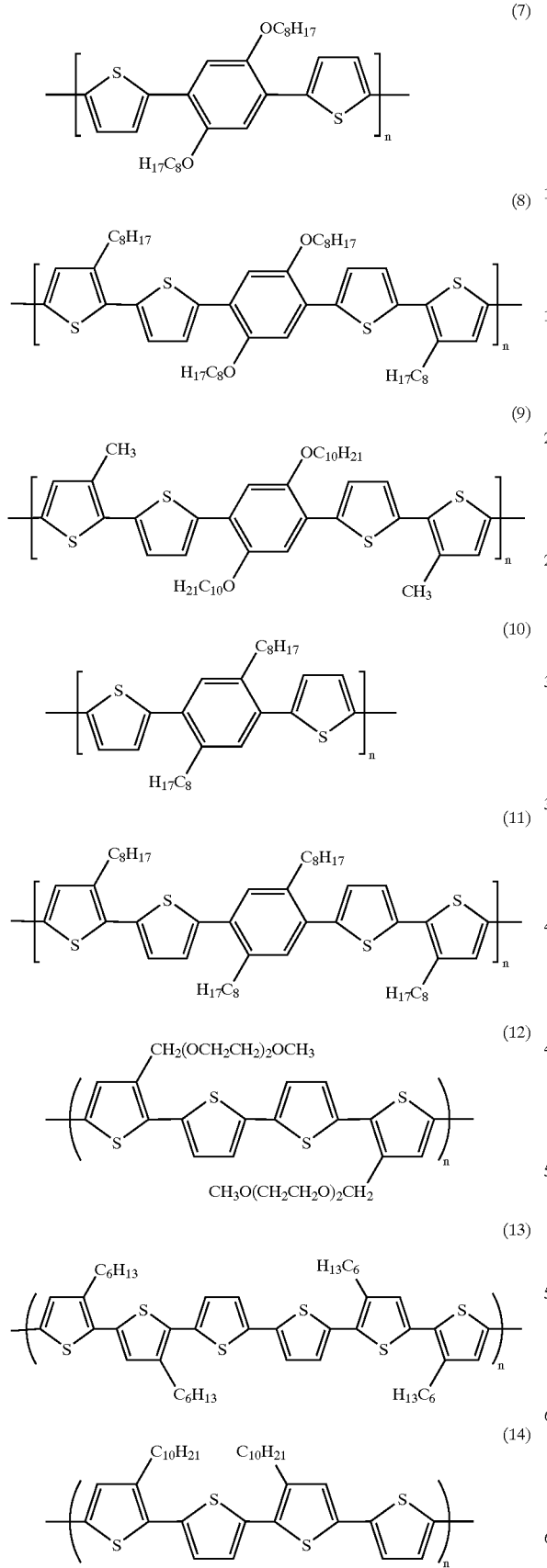
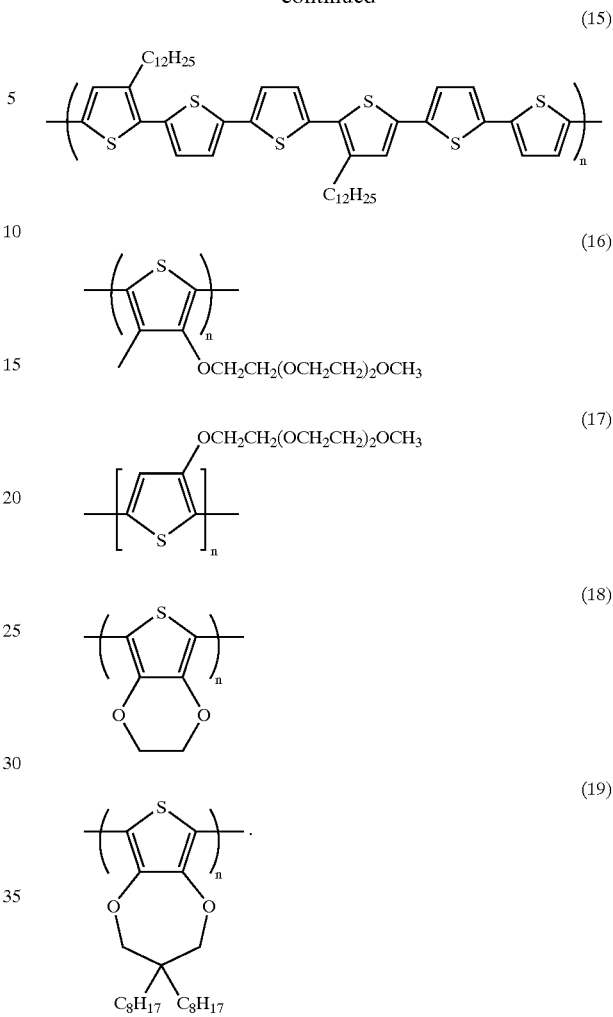

20. A device in accordance with claim 7 wherein said device is a thin film transistor comprising a substrate, a gate electrode, an insulating dielectric layer, source and drain electrodes, and in contact with said dielectric layer and said source and drain electrodes, a semiconductor layer comprised of said polythiophene.

21. A thin film transistor in accordance with claim 20 wherein said metal halide is ferric chloride, and said polymerization solvent is selected from the group consisting of bromobenzene, chlorobenzene, dichlorobenzene, trichlorobenzene, chloronaphthalene, and tetrahydronaphthalene.

22. A thin film transistor in accordance with claim 20 wherein said solvent is chlorobenzene or dichlorobenzene.

23. A thin film transistor in accordance with claim 20 wherein said polythiophene possesses a number average molecular weight ($M_n$) of from about 7,000 to about 30,000, and a weight average molecular weight ($M_w$) of about 10,000 to about 100,000.

24. A thin film transistor in accordance with claim 20 wherein said substrate is a polyester, a polycarbonate, or a polyimide; said gate source and drain electrodes are each independently comprised of gold, nickel, aluminum, platinum, indium titanium oxide, or a conductive polymer; and said gate is a dielectric layer comprised of silicon nitride or silicon oxide.

25. A thin film transistor in accordance with claim 20 wherein said substrate is glass or a plastic sheet; said gate, source and drain electrodes are each comprised of gold; and said gate dielectric layer is comprised of the organic polymer poly(methacrylate), or poly(vinyl phenol).

26. A thin film transistor in accordance with claim 20 wherein said polythiophene layer is formed by solution processes of spin coating, stamp printing, screen printing, or jet printing.

27. A thin film transistor in accordance with claim 20 wherein said gate, source and drain electrodes, said gate dielectric, and semiconductor layers are formed by solution processes of spin coating, solution casting, stamp printing, screen printing, or jet printing.

28. A thin film transistor in accordance with claim 20 wherein the substrate is a polyester, a polycarbonate, or a polyimide, and the gate, source and drain electrodes are fabricated from the organic conductive polymer polystyrene sulfonate-doped poly(3,4-ethylene dioxythiophene), or from a conductive ink/paste compound of a colloidal dispersion of silver in a polymer binder, and the gate dielectric layer is an organic polymer or an inorganic oxide polymer composite.

29. A device in accordance with claim 1 wherein said halide is chloride or fluoride, or wherein said halide is bromide or iodide.

30. A device in accordance with claim 1 wherein alkyl and alkoxy each contain from 1 to about 25 carbon atoms, and optionally wherein alkyl and alkoxy each contain from 2 to about 12 carbon atoms.

31. A device in accordance with claim 1 wherein D is phenylene, and optionally wherein D is a substituted aryl, or biphenylene.

32. A device in accordance with claim 1 wherein there is selected for said polymerization a monomer of 3-alkylthiophene, 2,5-bis(2-thienyl)-3,4-dialkylthiophene, 2,5-bis(2-thienyl)-3,4-dialkoxythiophene, 2,5-bis(3-alkyl-2-thienyl)thiophene, 2,5-bis(3-alkoxy-2-thienyl)thiophene, 5,5'-bis(3-alkyl-2-thienyl)-2,2'-dithiophene, 5,5'-bis(3-alkoxy-2-thienyl)-2,2'-dithiophene, 1,4-bis(2-thienyl)-2,5-dialkylbenzene, 1,4-bis(2-thienyl)-2,5-dialkoxybenzene, 3,4-ethylenedioxythiophene, 3,4-(2,2-dialkylpropylene-1,3-dioxy)thiophene, or 3-methyl-4-alkoxythiophene.

33. A device in accordance with claim 21 wherein said solvent is selected in an amount of from about 250 to about 5,000 milliliters per mole of thiophene monomer.

34. A device in accordance with claim 22 wherein said solvent is selected in an amount of from about 250 to about 5,000 milliliters per mole of thiophene monomer.

35. A thin film transistor comprised of the polythiophene of claim 1.

36. A thin film transistor transistor comprised of the polythiophene of claim 7, or comprised of the polythiophene of claim 19.

37. A thin film transistor comprised of a polythiophene, which polythiophene has a number average molecular weight ($M_n$) of from about 2,000 to about 100,000, and a weight average molecular weight ($M_w$) of from about 4,000 to about 500,000, both as measured by gel permeation chromatography using polystyrene standars, and which polythiophene is comprised of a monomer unit containing at least one of 2,5-thienylene segment (I), and at least one 2,5-thienylene segment (II), and a divalent D

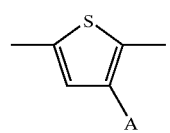
(I)

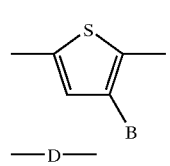
(II)

wherein A is alkyl or alkoxy; B is a halide; and D is a divalent linkage for said (I) and (II).

* * * * *

UNITED STATES PATENT AND TRADEMARK OFFICE
CERTIFICATE OF CORRECTION

PATENT NO. : 6,897,284 B2
DATED : May 24, 2005
INVENTOR(S) : Liu et al.

Page 1 of 1

It is certified that error appears in the above-identified patent and that said Letters Patent is hereby corrected as shown below:

Column 1,
Line 49, insert the following section:
-- STATEMENT REGARDING FEDERALLY SPONSORED RESEARCH OR DEVELOPMENT This invention was made with United States Government support Cooperative Agreement No. 70NANBOH3033 awarded by the National Institute of Standards and Technology (NIST). The United States Government has certain rights in the invention. --.

Signed and Sealed this

Twenty-second Day of November, 2005

JON W. DUDAS
*Director of the United States Patent and Trademark Office*

UNITED STATES PATENT AND TRADEMARK OFFICE
CERTIFICATE OF CORRECTION

PATENT NO. : 6,897,284 B2  
APPLICATION NO. : 10/392592  
DATED : May 24, 2005  
INVENTOR(S) : Liu et al.

Page 1 of 1

It is certified that error appears in the above-identified patent and that said Letters Patent is hereby corrected as shown below:

In the Specification

Column 1,
Line 49, insert the following section:
-- STATEMENT REGARDING FEDERALLY SPONSORED RESEARCH OR DEVELOPMENT This invention was made with United States Government support Cooperative Agreement No. 70NANB0H3033 awarded by the National Institute of Standards and Technology (NIST). The United States Government has certain rights in the invention. --.

This certificate supersedes the Certificate of Correction issued November 22, 2005.

Signed and Sealed this
Seventeenth Day of September, 2013

Teresa Stanek Rea
*Deputy Director of the United States Patent and Trademark Office*